(12) United States Patent
Hwang

(10) Patent No.: US 10,594,265 B2
(45) Date of Patent: Mar. 17, 2020

(54) SEMICONDUCTOR DEVICE AND SEMICONDUCTOR INTEGRATED CIRCUIT USING THE SAME

(71) Applicant: SK hynix Inc., Icheon-si Gyeonggi-do (KR)

(72) Inventor: Kyu Dong Hwang, Cheongju-si Chungcheongbuk-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/053,353

(22) Filed: Aug. 2, 2018

(65) Prior Publication Data
US 2019/0097581 A1  Mar. 28, 2019

(30) Foreign Application Priority Data

Sep. 27, 2017 (KR) .......................... 10-2017-0125272

(51) Int. Cl.
| H03F 3/45 | (2006.01) |
| H03F 1/02 | (2006.01) |
| H03F 3/16 | (2006.01) |
| H03K 3/356 | (2006.01) |
| H03F 3/72 | (2006.01) |

(52) U.S. Cl.
CPC .............. *H03F 1/025* (2013.01); *H03F 3/16* (2013.01); *H03F 3/72* (2013.01); *H03K 3/356026* (2013.01); *H03F 2200/471* (2013.01); *H03F 2200/87* (2013.01)

(58) Field of Classification Search
CPC .................................... H03F 3/45; H03K 5/08
USPC .......................... 330/252, 253; 327/309, 333
See application file for complete search history.

(56) References Cited

U.S. PATENT DOCUMENTS

| 5,182,560 A * | 1/1993 | Shiwaku ................ G11C 7/062 |
| | | 327/51 |
| 6,483,386 B1 * | 11/2002 | Cress ...................... H03F 1/523 |
| | | 327/309 |

FOREIGN PATENT DOCUMENTS

| KR | 100995315 B1 | 11/2010 |
| KR | 1020130083767 A | 7/2013 |

* cited by examiner

*Primary Examiner* — Steven J Mottola
(74) *Attorney, Agent, or Firm* — William Park & Associates Ltd.

(57) ABSTRACT

A semiconductor device may include an amplification circuit. The amplification circuit may be configured to generate an output signal and an output bar signal based on a mode signal, first and second control signals, an input signal, and an input bar signal. The amplification circuit may determine voltage levels of the output signal and the output bar signal based on the mode signal and the first and second control signals regardless of the input signal and the input bar signal.

20 Claims, 1 Drawing Sheet

SEMICONDUCTOR DEVICE AND SEMICONDUCTOR INTEGRATED CIRCUIT USING THE SAME

CROSS-REFERENCES TO RELATED APPLICATION

The present application claims priority under 35 U.S.C. § 119(a) to Korean application number 10-2017-0125272, filed on Sep. 27, 2017, in the Korean Intellectual Property Office, which is incorporated herein by reference in its entirety.

BACKGROUND

1. Technical Field

Various embodiments may generally relate to a semiconductor integrated circuit, more particularly, to a semiconductor device and a semiconductor integrated circuit using the same.

2. Related Art

A semiconductor device may be configured to receive and transmit electrical signals.

In order to have the semiconductor device with low power consumption and rapid operational speed, it may be required to decrease power for receiving and transmitting the electrical signals.

SUMMARY

In accordance with embodiments of the present disclosure, a semiconductor device may include an amplification circuit. The amplification circuit may be configured to generate an output signal and an output bar signal based on a mode signal, first and second control signals, an input signal, and an input bar signal. The amplification circuit may determine voltage levels of the output signal and the output bar signal based on the mode signal and the first and second control signals regardless of the input signal and the input bar signal.

In accordance with embodiments of the present disclosure, a semiconductor integrated circuit may include at least one semiconductor device. The semiconductor device may be configured to generate an output signal and an output bar signal based on a mode signal, a reset signal, an input signal, and an input bar signal. When the mode signal is enabled, the semiconductor device may generate the output signal and the output bar signal having substantially the same level. When the mode signal is disabled, the semiconductor device may generate the output signal and the output bar signal having different levels based on the reset signal, the input signal, and the input bar signal.

In accordance with embodiments of the present disclosure, a semiconductor device may include a latch circuit and a power block circuit. The latch circuit may be configured to detect and amplify voltage levels of first and second output nodes based on an input signal and an input bar signal. The power block circuit may be configured to supply or block an external voltage to the latch circuit based on a mode signal. The first and second output nodes may be pulled-down based on the mode signal.

BRIEF DESCRIPTION OF THE DRAWINGS

Aspects, features, and advantages of the subject matter of the present disclosure are described in detail with reference to the figures listed below.

DETAILED DESCRIPTION

Various embodiments will be described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments will be shown and described, it will be appreciated by those of ordinary skill in the art that changes may be made in these embodiments without departing from the principles and spirit of the present disclosure.

Embodiments of the present disclosure may provide a semiconductor device that may be capable of decreasing power in accordance with operational modes.

Various embodiments may also provide a semiconductor integrated circuit using the semiconductor device.

According to various embodiments, the semiconductor device may have low power consumption in accordance with operational modes.

Figure 1:
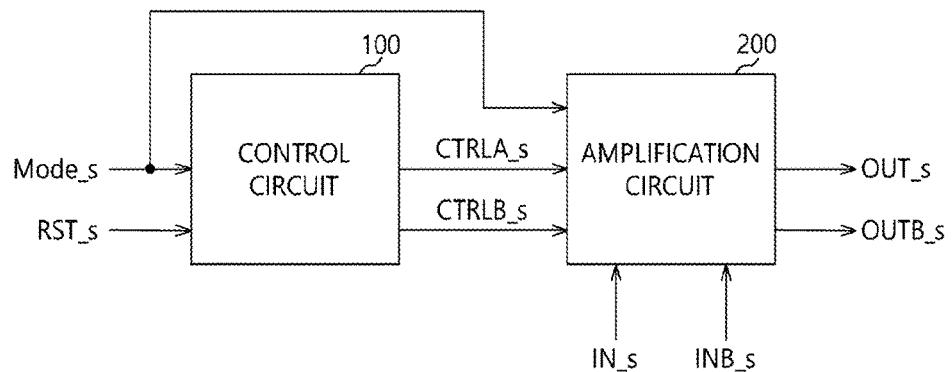
FIG. 1 is a circuit diagram illustrating a semiconductor device in accordance with various embodiments.

FIG. 1 is a circuit diagram illustrating a semiconductor device in accordance with various embodiments.

Referring to FIG. 1, a semiconductor device of an embodiment may include a control circuit 100 and an amplification circuit 200.

The control circuit 100 may be configured to generate a first control signal CTRLA_s and a second control signal CTRLB_s in response to a mode signal Mode_s and a reset signal RST_s. For example, the control circuit 100 may generate the first control signal CTRLA_s and the second control signal CTRLB_s having substantially the same level in response to the mode signal Mode_s and the reset signal RST_s. Alternatively, the control circuit 100 may generate the first control signal CTRLA_s and the second control signal CTRLB_s having different levels in response to the mode signal Mode_s and the reset signal RST_s.

Particularly, when the mode signal Mode_s is enabled, the control circuit 100 may enable the first and second control signals CTRLA_s and CTRLB_s to a high level regardless of the reset signal RST_s. When the mode signal Mode_s is disabled, the control circuit 100 may output the first and second control signals CTRLA_s and CTRLB_s having different levels in response to the reset signal RST_s. When the mode signal Mode_s is disabled and the reset signal RST_s is enabled, the control circuit 100 may output the first control signal CTRLA_s having a high level and the second control signal CTRLB_s having a low level. When the mode signal Mode_s and the reset signal RST_s are disabled, the control circuit 100 may output the first control signal CTRLA_s having a low level and the second control signal CTRLB_s having a high level. Here, the mode signal Mode_s may correspond to a signal enabled to the high level and disabled to the low level. The reset signal RST_s may correspond to a signal enabled to a low level and disabled to a high level.

The amplification circuit 200 may be configured to generate an output signal OUT_s and an output bar signal OUTB_s in response to the mode signal Mode_s, the first and second control signals CTRLA_s and CTRLB_s, an input signal IN_s, and an input bar signal INB_s. For example, when the mode signal Mode_s and the reset signal RST_s are disabled, the amplification circuit 200 may output the output signal OUT_s and the output bar signal OUTB_s having different levels in response to the input signal IN_s and the input bar signal INB_s. That is, when the mode signal Mode_s and the reset signal RST_s are disabled, the amplification circuit 200 may output the output signal OUT_S and the output bar signal OUTB_s having different levels based on the input signal IN_s and the input bar signal INB_s.

When the mode signal Mode_s is enabled and the first and second control signals CTRLA_s CTRLB_s having a high level are inputted, the amplification circuit 200 may output the output signal OUT_s and the output bar signal OUTB_s having substantially the same level regardless of the input signal IN_s and the input bar signal INB_s. That is, when the mode signal Mode_s is enabled and the first and second control signals CTRLA_s CTRLB_s having a high level are inputted, the amplification circuit 200 may output the output signal OUT_s and the output bar signal OUTB_s having a low level regardless of the input signal IN_s and the input bar signal INB_s.

When the mode signal Mode_s is disabled, the first control signal CTRLA_s having a high level is inputted, and the second control signal CTRLB_s having a low level is inputted, the amplification circuit 200 may output the output signal OUT_s having a low level and the output bar signal OUTB_s having a high level regardless of the input signal IN_s and the input bar signal INB_s.

Figure 2:
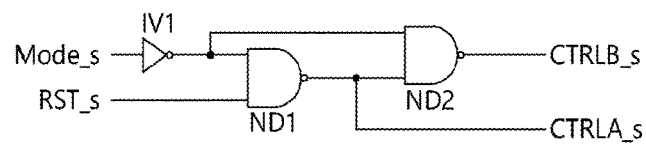
FIG. 2 is a circuit diagram illustrating a control circuit of the semiconductor device of FIG. 1 in accordance with an embodiment.

FIG. 2 is a circuit diagram illustrating a control circuit of the semiconductor device of FIG. 1 in accordance with an embodiment.

Referring to FIG. 2, the control circuit 100 may include an inverter IV1, a first NAND gate ND1, and a second NAND gate ND2. The inverter IV1 may be configured to receive the mode signal Mode_s. The first NAND gate ND1 may be configured to receive an output signal from the inverter IV1 and the reset signal RST_s. The second NAND gate ND2 may be configured to receive the output signal from the inverter IV1 and an output signal from the first NAND gate ND1. The output signal of the first NAND gate ND1 may correspond to the first control signal CTRLA_s. An output signal of the second NAND gate ND2 may correspond to the second control signal CTRLB_s.

Figure 3:
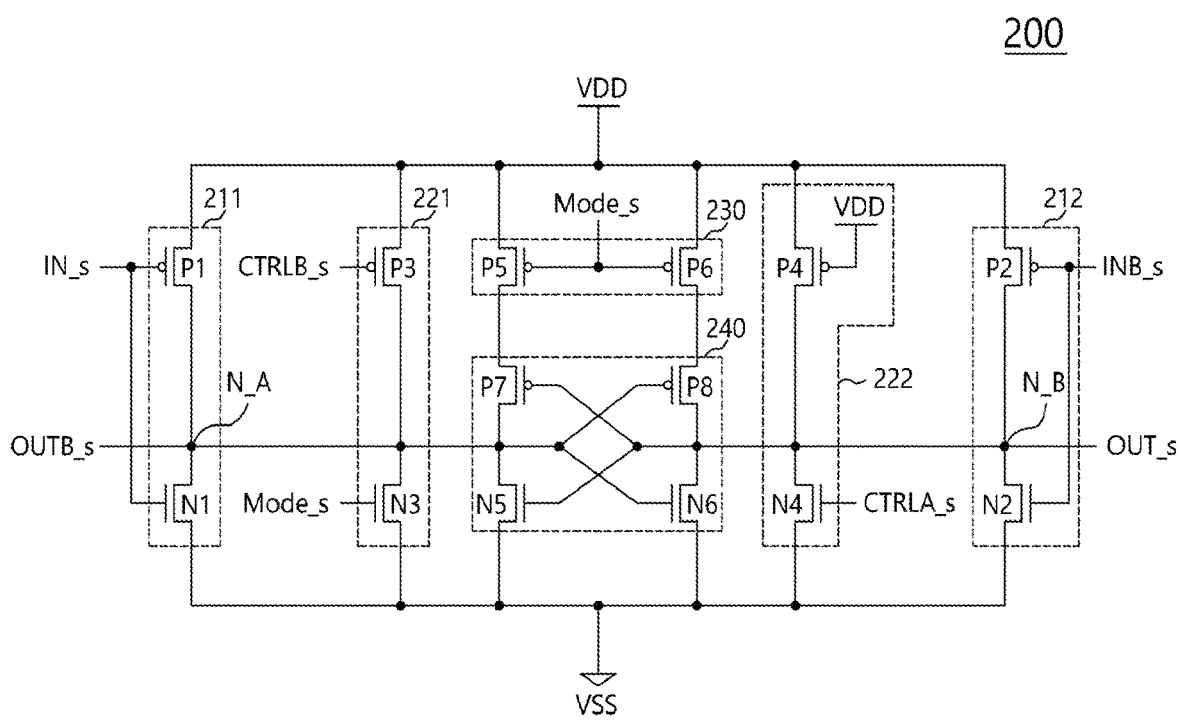
FIG. 3 is a circuit diagram illustrating an amplification circuit of the semiconductor device of FIG. 1 in accordance with an embodiment.

FIG. 3 is a circuit diagram illustrating an amplification circuit of the semiconductor device of FIG. 1 in accordance with an embodiment.

Referring to FIG. 3, the amplification circuit 200 may include a first input circuit 211, a second input circuit 212, a first output signal level determination circuit 221, a second output signal level determination circuit 222, a power block circuit 230, and a latch circuit 240.

The first input circuit 211 may be configured to pull-up or pull-down a first output node N_A in response to the input signal IN_s. For example, when the input signal IN_s has a low level, the first input circuit 211 may pull-up the first output node N_A. In contrast, when the input signal IN_s has a high level, the first input circuit 211 may pull-down the first output node N_A.

The first input circuit 211 may include a first transistor P1 and a second transistor N1. The first transistor P1 may include a gate configured to receive the input signal IN_s, a source configured to receive an external voltage VDD, and a drain connected with the first output node N_A. The second transistor N1 may include a gate configured to receive the input signal IN_s, a drain connected with the first output node N_A, and a source connected with a ground terminal VSS.

The second input circuit 212 may be configured to pull-up or pull-down a second output node N_B in response to the input bar signal INB_s. For example, when the input bar signal INB_s has a low level, the second input circuit 212 may pull-up the second output node N_B. In contrast, when the input bar signal INB_s has a high level, the second input circuit 212 may pull-down the second output node N_B.

The second input circuit 212 may include a third transistor P2 and a fourth transistor N2. The third transistor P2 may include a gate configured to receive the input bar signal INB_s, a source configured to receive the external voltage VDD, and a drain connected with the second output node N_B. The fourth transistor N2 may include a gate configured to receive the input bar signal INB_s, a drain connected with the second output node N_B, and a source connected with the ground terminal VSS.

The first output signal level determination circuit 221 may be configured to pull-up or pull-down the first output node N_A in response to the second control signal CTRLB_s and the mode signal Mode_s. For example, when the second control signal CTRLB_s has a low level, the first output signal level determination circuit 221 may pull-up the first output node N_A. When the mode signal Mode_s is enabled to a high level, the first output signal level determination circuit 221 may pull-down the first output node N_A. When the second control signal CTRLB_s has a high level and the mode signal Mode_s has a low level, the first output signal level determination circuit 221 might not pull-up or pull-down the first output node N_A.

The first output signal level determination circuit 221 may include a fifth transistor P3 and a sixth transistor N3. The fifth transistor P3 may include a gate configured to receive the second control signal CTRLB_s, a source configured to receive the external voltage VDD, and a drain connected with the first output node N_A. The sixth transistor N3 may include a gate configured to receive the mode signal Mode_s, a drain connected with the first output node N_A, and a source connected with the ground terminal VSS.

The second output signal level determination circuit 222 may be configured to pull-down the second output node N_B in response to the first control signal CTRLA_s. For example, when the first control signal CTRLA_s has a high level, the second output signal level determination circuit 222 may pull-down the second output node N_B. When the first control signal CTRLA_s has a low level, the second output signal level determination circuit 222 might not pull-down the second output node N_B.

The second output signal level determination circuit 222 may include a seventh transistor P4 and an eighth transistor N4. The seventh transistor P4 may include a gate configured to receive the external voltage VDD, a source configured to receive the external voltage VDD, and a drain connected with the second output node N_B. The eighth transistor N4 may include a gate configured to receive the first control signal CTRLA_s, a drain connected with the second output node N_B, and a source connected with the ground terminal VSS.

The power block circuit 230 may be configured to supply or is block the external voltage VDD to the latch circuit 240 in response to the mode signal Mode_s. For example, when the mode signal Mode_s is enabled to a high level, the power block circuit 230 may block the external voltage VDD supplied to the latch circuit 240. When the mode signal Mode_s is enabled to a low level, the power block circuit 230 may supply the external voltage VDD to the latch circuit 240.

The power block circuit 230 may include a ninth transistor P5 and a tenth transistor P6. The ninth transistor P5 may include a gate configured to receive the mode signal Mode_s, a source configured to receive the external voltage VDD, and a drain connected with the latch circuit 240. The tenth transistor P6 may include a gate configured to receive the mode signal Mode_s, a source configured to receive the external voltage VDD, and a drain connected with the latch circuit 240.

The latch circuit 240 may be configured to detect and amplify voltage levels of the first and second output nodes N_A and N_B. The latch circuit 240 may be configured to maintain the voltage levels of the first and second output nodes N_A and N_B. For example, when the voltage level of the first output node N_A is to higher than the voltage level of the second output node N_B, the latch circuit 240 may amplify the first output node N_A to a high voltage level and the second output node N_B to a low voltage level to maintain the voltage levels of the first and second output nodes N_A and N_B. In contrast, when the voltage level of the first output is node N_A is lower than the voltage level of the second output node N_B, the latch circuit 240 may amplify the first output node N_A to a low voltage level and the second output node N_B to a high voltage level to maintain the voltage levels of the first and second output nodes N_A and N_B.

The latch circuit 240 may include an eleventh to fourteenth transistors P7, P8, N5, and N6. The eleventh transistor P7 may include a gate connected with the second output node N_B, a source connected with the drain of the ninth transistor P5, and a drain connected with the first output node N_A. The twelfth transistor P8 may include a gate connected with the first output node N_A, a source connected with the drain of the tenth transistor P6, and a drain connected with the second output node N_B. The thirteenth transistor N5 may include a gate connected with the second output node N_B, a source connected with the ground terminal VSS, and a drain connected with the first output node N_A. The fourteenth transistor N6 may include a gate connected with the first output node N_A, a source connected with the ground terminal VSS, and a drain connected with the second output node N_B. Here, the voltage level of the first output node N_A may be outputted as a voltage level of the output bar signal OUTB_s. The voltage level of the second output node N_B may be outputted as a voltage level of the output signal OUT_s.

Hereinafter, operations of the semiconductor device will be illustrated below.

An operation of the semiconductor device when the mode signal Mode_s and the reset signal RST_s are disabled will be illustrated below.

When the mode signal Mode_s is disabled to a low level and the reset signal RST_s is disabled to a high level, the control circuit 100 may output the first control signal CTRLA_s having a low level and the second control signal CTRLB_s having a high level.

The amplification circuit 200 may receive the mode signal Mode_s disabled to the low level, the first control signal CTRLA_s having the low level, and the second control signal CTRLB_s having the high level. The amplification circuit 200 may output the output signal OUT_s and the output bar signal OUTB_s in response to the input signal IN_s and the input bar signal INB_s.

Particularly, the power block circuit 230 may supply the external voltage VDD to the latch circuit 240 in response to the mode signal Mode_s disabled to the low level.

The first output signal level determination circuit 221 may receive the mode signal Mode_s disabled to the low level and the second control signal CTRLB_s having the high level. The first output signal level determination circuit 221 might not pull-up or pull-down to the first output node N_A. That is, the fifth and sixth transistors P3 and N3 of the first output signal level determination circuit 221 may be turned-off in response to the mode signal Mode_s having the low level and the second control signal CTRLB_s having the high level so that the first output signal level determination circuit 221 might not is pull-up or pull-down the first output node N_A.

The second output signal level determination circuit 222 may receive the first control signal CTRLA_s having the low level. The second output signal level determination circuit 222 might not pull-down the second output node N_B. That is, the eighth transistor N4 of the second output signal level determination circuit 222 may be turned-off in response to the first control signal CTRLA_s having the low level so that the second output signal level determination circuit 222 might not pull-down the second output node N_B.

When the first output signal level determination circuit 221 does not pull-up or pull-down the first output node N_A and the second output signal level determination circuit 222 does not pull-down the second output node N_B, the amplification circuit 200 may determine the voltage levels of the first and second output nodes N_A and N_B by the first and second input circuits 211 and 212. Here, the voltage levels of the first and second output nodes N_A and N_B may be amplified by the latch circuit 240 to which the external voltage VDD of the amplification circuit 200 may be supplied. The amplified voltage levels of the first and second output nodes N_A and N_B may be maintained.

For example, when the input signal IN_s has a low level and the input bar signal INB_s has a high level, the first input circuit 211 may pull-up the first output node N_A and the second input circuit 212 may pull-down the second output node N_B. The latch circuit 240 may amplify the pulled-up first output node N_A to a high voltage level and the pulled-down second output node N_B to a low voltage level to maintain the voltage levels of the first and second output nodes N_A and N_B. When the input signal IN_s has a high level and the input bar signal INB_s has a low level, the first input circuit 211 may pull-down the first output node N_A and the second input circuit 212 may pull-up the second output node N_B. The latch circuit 240 may amplify the pulled-down first output node N_A to a low voltage level and the pulled-up second output node N_B to a high voltage level to maintain the voltage levels of the first and second output nodes N_A and N_B. The voltage level of the first output node N_A may be outputted as the voltage level of the output bar signal OUTB_s and the voltage level of the second output node N_B may be outputted as the voltage level of the output signal OUT_s.

Therefore, when the mode signal Mode_s and the reset signal RST_s are disabled, the amplification circuit 200 may vary the voltage levels of the output signal OUT_s and the output bar signal OUTB_s in response to the input signal IN_s and the input bar signal INB_s.

According to examples of embodiments, when the mode signal Mode_s and the reset signal RST_s are disabled, the semiconductor device may vary the voltage levels of the output signal OUT_s and the output bar signal OUTB_s in response to the input signal IN_s and the input bar signal INB_s.

An operation of the semiconductor device when the mode signal Mode_s is enabled to a high level will be illustrated below.

When the mode signal Mode_s is enabled to the high level, the control circuit 100 may output the first control signal CTRLA_s having a high level and the second control signal CTRLB_s having a high level regardless of the reset signal RST_s.

The amplification circuit 200 may receive the mode signal Mode_s having the high level, the first control signal CTRLA_s having the high level and the second control signal CTRLB_s having the high level. The amplification circuit 200 may output the output signal OUT_s having a low level and the output bar signal OUTB_s having a low level regardless of the input signal IN_s and the input bar signal INB_s.

Particularly, the power block circuit 230 may receive the mode signal Mode_s enabled to the high level to block the external voltage VDD supplied to the latch circuit 240. Thus, the latch circuit 240 may not detect and amplify the voltage levels of the first and second output nodes N_A and N_B.

The first output signal level determination circuit 221 may pull-down the first output node N_A in response to the mode signal Modes enabled to the high level. That is, the fifth transistor P3 of the first output signal level determination circuit 221 may receive the second control signal CTRLB_s having the high level. Thus, the fifth transistor P3 of the first output signal level determination circuit 221 may be turned-off so that the fifth transistor P3 might not pull-up the first output node N_A. The sixth transistor N3 of the first output signal level determination circuit 221 may receive the second control signal CTRLB_s having the high level. The sixth transistor N3 of the first output signal level determination circuit 221 may be turned-on so that the sixth transistor N3 may pull-down the first output node N_A.

The second output signal level determination circuit 222 may receive the first control signal CTRLA_s having the high level. The second output signal level determination circuit 222 may pull-down the second output node N_B. That is, the eighth transistor N4 of the second output signal level determination circuit 222 may receive the first control signal CTRLA_s having the high level. The eighth transistor N4 may be turned-on so that the eighth transistor N4 may pull-down the second output node N_B.

When the first and second output signal level determination circuits 221 and 222 pull-down the first output node N_A and the second output node N_B, the pull-up operation and the pull-down operation of the first and second input circuits 211 and 212 in response to the input signal IN_s and input bar signal INB_s may have no influence on the voltage levels of the first and second output nodes N_A and N_B. These operations may be determined by sizes of the transistors in the first and second output signal level determination circuits 221 and 222 and the first and second input circuits 211 and 212.

As a result, when the mode signal Mode_s is enabled to the high level, the amplification circuit 200 might not vary the voltage levels of the output signal OUT_s and the output bar signal OUTB_s in response to the input signal IN_s and the input bar signal INB_s. Thus, the output signal OUT_s and the output bar signal OUTB_s may be fixed to the low level regardless of the input signal IN_s and the input bar signal INB_s.

According to examples of embodiments, when the mode signal Mode_s is enabled, the output signal OUT_s and the output bar signal OUTB_s may be fixed to the low level regardless of the input signal IN_s and the input bar signal INB_s.

An operation of the semiconductor device when the mode signal Mode_s is disabled to a low level and the reset signal RST_s is enabled to a low level will be illustrated below.

When the mode signal Mode_s is disabled to the low level and the reset signal RST_s is enabled to the low level, the control circuit 100 may output the first control signal CTRLA_s having a high level and the second control signal CTRLB_s having a low level.

The amplification circuit 200 may receive the mode signal Mode_s having the low level, the first control signal CTRLA_s having the high level, and the second control signal CTRLB_s having the low level. The amplification circuit 200 may output the output signal OUT_s having a low level and the output bar signal OUTB_s having a to high level regardless of the input signal IN_s and the input bar signal INB_s.

Particularly, the power block circuit 230 may receive the mode signal Mode_s disabled to the low level to supply the external voltage VDD to the latch circuit 240. Thus, the latch circuit 240 may is detect and amplify the voltage levels of the first and second output nodes N_A and N_B.

The first output signal level determination circuit 221 may pull-up the first output node N_A in response to the second control signal CTRLB_s having the low level. That is, the fifth transistor P3 of the first output signal level determination circuit 221 may receive the second control signal CTRLB_s having the low level, Thus, the fifth transistor P3 of the first output signal level determination circuit 221 may be turned-on so that the fifth transistor P3 may pull-up the first output node N_A. The sixth transistor N3 of the first output signal level determination circuit 221 may receive the mode signal Mode_s having the low level. The sixth transistor N3 of the first output signal level determination circuit 221 may be turned-off so that the sixth transistor N3 might not pull-down the first output node N_A.

The second output signal level determination circuit 222 may receive the first control signal CTRLA_s having the high level. The second output signal level determination circuit 222 may pull-down the second output node N_B. That is, the eighth transistor N4 of the second output signal level determination circuit 222 may receive the first control signal CTRLA_s having the high level. The to eighth transistor N4 may be turned-on so that the eighth transistor N4 may pull-down the second output node N_B.

When the first output signal level determination circuit 221 pulls-up the first output node N_A and the second output signal level determination circuit 222 pulls-down the second output node N_B, is the pull-up operation and the pull-down operation of the first and second input circuits 211 and 212 in response to the input signal IN_s and input bar signal INB_s may have no influence on the voltage levels of the first and second output nodes N_A and N_B. These operations may be determined by sizes of the transistors in the first and second output signal level determination circuits 221 and 222 and the first and second input circuits 211 and 212.

The latch circuit 240 may detect and amplify the voltage levels of the pulled-up first output node N_A and the pulled-down second output node N_B. The latch circuit 240 may amplify the first output node N_A to the high level and the second output node N_B to the low level to maintain the voltage levels of the first and second output nodes N_A and N_B.

As a result, when the mode signal Mode_s is disabled to the low level and the reset signal RST_s is enabled to the low level, the amplification circuit 200 may not vary the voltage levels of the output signal OUT_s and the output bar signal OUTB_s in response to the input signal IN_s and the input bar signal INB_s. Thus, the output signal OUT_s and the output bar signal OUTB_s may be fixed to the low level and the high level, respectively, regardless of the input to signal IN_s and the input bar signal INB_s.

According to examples of embodiments, when the mode signal Mode_s is disabled, the output signal OUT_s and the output bar signal OUTB_s may be fixed to the low level and the high level, respectively, in response to the reset signal RST_s regardless of the is input signal IN_s and the input bar signal INB_s.

Therefore, the semiconductor device according to these examples of embodiments may fix the level of the output signal in response to the mode signal and the reset signal regardless of the input signals. When the mode signal is enabled, the semiconductor device may fix the output signal and the output bar signal to the low level. When the reset signal is enabled under a condition that all of the signals are disabled, the semiconductor device may fix the output signal to the low level and the output bar signal to the high level.

Particularly, when the semiconductor device of these examples of embodiments is not used, that is, the mode signal Mode_s is enabled, the output signal and the output bar signal may be fixed to the low level so that power consumption may be relatively reduced compared to when the output signal and the output bar signal are fixed to the high level. Further, when the semiconductor device of these examples of embodiments is used, that is, the mode signal Mode_s is disabled, the output signal and the output bar signal may be fixed to an initial signal level in response to the reset signal RST_s. When the reset signal is enabled under a condition that all of the signals are disabled, the semiconductor device may fix the output to signal to the low level and the output bar signal to the high level.

A semiconductor integrated circuit configured to transmit electrical signals may use the semiconductor device of these examples of embodiments to detect and amplify the electrical signals.

Presented embodiments of the present disclosure are is intended to be illustrative and not to limit the present disclosure, Various alternative and functionally similar embodiments are possible. The present disclosure is not limited by the embodiments described herein, Nor is the present disclosure limited to any specific type of semiconductor device. Possible additions, subtractions, or modifications to presented embodiments falling within the scope of the appended claims will be understood by those of skill in the art.

What is claimed is:

1. A semiconductor device comprising:
    an amplification circuit configured to generate an output signal and an output bar signal based on a mode signal, first and second control signals, an input signal, and an input bar signal; and
    a control circuit configured to generate the first and second control signals based on the mode signal and a reset signal,
    wherein the amplification circuit determines voltage levels of the output signal and the output bar signal based on the mode signal and the first and second control signals regardless of the input signal and the input bar signal.

2. The semiconductor device of claim 1, wherein the control circuit outputs the first and second control signals having substantially a same level or different levels based on the mode signal and the reset signal.

3. The semiconductor device of claim 1,
    wherein the control circuit outputs the first and second control signals having substantially the same level when the mode signal is enabled, and
    wherein the control circuit outputs the first and second control signals having the different levels when the mode signal is disabled.

4. The semiconductor device of claim 1,
    wherein the control circuit outputs the first and second control signals having a first level when the mode signal is enabled,
    wherein the control circuit outputs the first control signal having the first level and the second control signal having a second level when the mode signal is disabled and the reset signal enabled, and
    wherein the control circuit outputs the first control signal having the second level and the second control signal having the first level when the mode signal and the reset signal are disabled.

5. The semiconductor device of claim 1,
    wherein the amplification circuit outputs the output signal and the output bar signal having a second level regardless of the input signal and the input bar signal when the mode signal is enabled and the first and second control signals having a first level are inputted into the amplification circuit,
    wherein the amplification circuit outputs the output signal having the second level and the output bar signal having the first level regardless of the input signal and the input bar signal when the mode signal is disabled and the first control signal having the first level and the second control signal having the second level are inputted into the amplification circuit, and
    wherein voltage levels of the output signal and the output bar signal are determined based on the input signal and the input bar signal when the mode signal is disabled and the first control signal having the second level and the second control signal having the first level are inputted into the amplification circuit.

6. The semiconductor device of claim 5, wherein the amplification circuit comprises:
    a first input circuit configured to pull-up or pull-down a first output node based on the input signal;
    a second input circuit configured to pull-up or pull-down a second output node based on the input bar signal;
    a first output signal level determination circuit configured to pull-up or pull-down the first output node based on the second control signal and the mode signal;
    a second output signal level determination circuit configured to pull-down the second output node based on the first control signal;
    a power block circuit configured to supply or block a voltage to a latch circuit based on the mode signal; and
    the latch circuit configured to detect and amplify voltage levels of the first and second output nodes, wherein the voltage level of the second output node is outputted as the voltage level of the output signal, and the voltage level of the first output node is outputted as the voltage level of the output bar signal.

7. The semiconductor device of claim 6,
wherein the first output signal level determination circuit pulls up the first output node when the second control signal has the second level, and
wherein the first output signal level determination circuit pulls down the first output node when the mode signal is enabled.

8. The semiconductor device of claim 6, wherein the second output signal level determination circuit pulls down the second output node when the first control signal has the first level.

9. A semiconductor integrated circuit comprising:
at least one semiconductor device configured to generate an output signal and an output bar signal based on a mode signal, a reset signal, an input signal, and an input bar signal,
wherein the semiconductor device outputs the output signal and the output bar signal having substantially a same level when the mode signal is enabled,
wherein the semiconductor device outputs the output signal and the output bar signal having different levels based on the reset signal, the input signal, and the input bar signal when the mode signal is disabled, and
wherein the semiconductor device comprises:
a control circuit configured to generate a first control signal and a second control signal based on the mode signal and the reset signal; and
an amplification circuit configured to generate the output signal and the output bar signal based on the mode signal, the first and second control signals, the input signal, and the input bar signal.

10. The semiconductor integrated circuit of claim 9,
wherein the control circuit fixes the first and second control signals to a first level regardless of the reset signal when the mode signal is enabled, and
wherein the control circuit fixes the first and second control signals to different levels based on the reset signal when the mode signal is disabled.

11. The semiconductor integrated circuit of claim 9,
wherein the control circuit fixes the first control signal to the first level and the second control signal to a second level when the mode signal is disabled and the reset signal is enabled, and
wherein the control circuit fixes the first control signal to the second level and the second control signal to the first level when the mode signal is disabled and the reset signal is disabled.

12. The semiconductor integrated circuit of claim 9, wherein the amplification circuit comprises:
at least one input circuit configured to pull-up or pull-down first and second output nodes based on the input signal and the input bar signal;
a first output signal level determination circuit configured to pull-up or pull-down the first output node based on the second control signal and the mode signal;
a second output signal level determination circuit configured to pull-down the second output node based on the first control signal;
a latch circuit configured to detect and amplify voltage levels of the first and second output nodes; and
a power block circuit configured to supply or block a voltage to the latch circuit based on the mode signal.

13. A semiconductor device comprising:
a latch circuit configured to detect and amplify voltage levels of first and second output nodes based on an input signal and an input bar signal; and
a power block circuit configured to supply or block an external voltage to the latch circuit based on a mode signal,
wherein the first and second output nodes are pulled-down when the mode signal is enabled.

14. The semiconductor device of claim 13,
wherein the power block circuit blocks the external voltage to the latch circuit when the mode signal is enabled, and
wherein the power block circuit supplies the external voltage to the latch circuit when the mode signal is disabled.

15. The semiconductor device of claim 13, wherein the semiconductor device further comprises:
a control circuit configured to generate first and second control signals having a first level regardless of a reset signal when the mode signal is enabled, and generate the first and second control signals having different levels based on the reset signal when the mode signal is disabled.

16. The semiconductor device of claim 15,
wherein the control circuit outputs the first control signal having the first level and the second control signal having a second level when the mode signal is disabled and the reset signal is enabled, and
wherein the control circuit outputs the first control signal having the second level and the second control signal having the first level when the mode signal is disabled and the reset signal is disabled.

17. The semiconductor device of claim 16, wherein the semiconductor device further comprises:
a first output signal level determination circuit configured to pull-up or pull-down the first output node based on the second control signal and the mode signal; and
a second output signal level determination circuit configured to pull-down the second output node based on the first control signal.

18. The semiconductor device of claim 17,
wherein the first output signal level determination circuit pulls-down the first output node when the mode signal is enabled, and
wherein the second output signal level determination circuit pulls-down the second output node when the first control signal has the first level.

19. The semiconductor device of claim 13, wherein the semiconductor further comprises:
a first input circuit configured to pull-up or pull-down the first output node based on the input signal; and
a second input circuit configured to pull-up or pull-down the second output node based on the input bar signal.

20. The semiconductor device of claim 13,
wherein the voltage level of the second output node is outputted as a voltage level of an output signal, and
wherein the voltage level of the first output node is outputted as a voltage level of an output bar signal.

* * * * *